US012805076B2

(12) United States Patent
Sato et al.

(10) Patent No.: US 12,805,076 B2
(45) Date of Patent: Nov. 17, 2026

(54) LIGHT EMITTING DEVICE

(71) Applicant: NICHIA CORPORATION, Anan (JP)

(72) Inventors: Tomoyuki Sato, Tokushima (JP); Shumpei Fujiwara, Anan (JP)

(73) Assignee: NICHIA CORPORATION, Anan (JP)

( * ) Notice: Subject to any disclaimer, the term of this patent is extended or adjusted under 35 U.S.C. 154(b) by 406 days.

(21) Appl. No.: 18/517,622

(22) Filed: Nov. 22, 2023

(65) Prior Publication Data

US 2024/0178350 A1 May 30, 2024

(30) Foreign Application Priority Data

Nov. 29, 2022 (JP) ................................ 2022-190640
Jul. 13, 2023 (JP) ................................ 2023-115117

(51) Int. Cl.
*H10H 20/851* (2025.01)
*H10W 90/00* (2026.01)

(52) U.S. Cl.
CPC ........ *H10H 20/8512* (2025.01); *H10W 90/00* (2026.01)

(58) Field of Classification Search
CPC .......................... H10H 20/8512; H10W 90/00
See application file for complete search history.

(56) References Cited

U.S. PATENT DOCUMENTS

2010/0320483 A1 12/2010 Kadotani et al.
2012/0056217 A1* 3/2012 Jung .................... H10H 20/857 257/89
2012/0193651 A1 8/2012 Edmond et al.
2013/0285568 A1 10/2013 Takeda
2014/0111894 A1 4/2014 Schug
2014/0291716 A1 10/2014 Ukawa

FOREIGN PATENT DOCUMENTS

| | | | |
|---|---|---|---|
| JP | 2010-267857 | A | 11/2010 |
| JP | 2011-009298 | A | 1/2011 |
| JP | 2012-532441 | A | 12/2012 |
| JP | 2013-051375 | A | 3/2013 |
| JP | 2014-519173 | A | 8/2014 |
| JP | 2014-525687 | A | 9/2014 |
| JP | 2014-209602 | A | 11/2014 |
| JP | 2016-042602 | A | 3/2016 |
| JP | 2020-205327 | A | 12/2020 |
| WO | WO-2012/086792 | A1 | 6/2012 |

OTHER PUBLICATIONS

Takeda, WO 2012/086790, Jun. 28, 2012 (Year: 2012).*

* cited by examiner

*Primary Examiner* — Mary Ellen Bowman
(74) *Attorney, Agent, or Firm* — Foley & Lardner LLP

(57) ABSTRACT

A light emitting device includes: a substrate having a first surface; a light source disposed on the first surface; a covering member disposed on the first surface and surrounding the light source in a plan view; and a circuit disposed on the substrate. The circuit includes a drive circuit, and a protection circuit that is connected in parallel to the drive circuit. The drive circuit is configured to drive the light source, and the protection circuit includes first and second protection elements that are connected in series with reversed polarities. The covering member covers the first and second protection elements.

11 Claims, 16 Drawing Sheets

LIGHT EMITTING DEVICE

CROSS-REFERENCE TO RELATED APPLICATIONS

This application is based on and claims priority to Japanese Patent Application No. 2022-190640, filed on Nov. 29, 2022, and Japanese Patent Application No. 2023-115117, filed on Jul. 13, 2023. The entire contents of these applications are incorporated herein by reference.

BACKGROUND

The present disclosure relates to a light emitting device.

Light emitting devices that include light emitting elements and electronic components mounted on a substrate are known. In such a light emitting device, in order to protect light emitting elements, protection circuits may be provided. For example, protection circuits composed of resistors and other components are connected in parallel to the light emitting elements (see Japanese Patent Publication No. 2016-042602, for example).

SUMMARY

One object of certain embodiments of the present disclosure is to reduce the size of a light emitting device that includes a protection circuit.

A light emitting device according to an embodiment of the present disclosure includes a substrate having a first surface; a light source disposed on the first surface; a covering member disposed on the first surface and surrounding the light source in a plan view; and a circuit disposed on the substrate. The circuit includes a drive circuit and a protection circuit that is connected in parallel to the drive circuit. The drive circuit is configured to drive the light source, and the protection circuit includes two protection elements that are connected in series with reversed polarities. The covering member covers the two protection elements.

BRIEF DESCRIPTION OF THE DRAWINGS

Other objects and further features of the present invention will be apparent from the following detailed description when read in conjunction with the accompanying drawings, in which.

DETAILED DESCRIPTION

Figure 1:
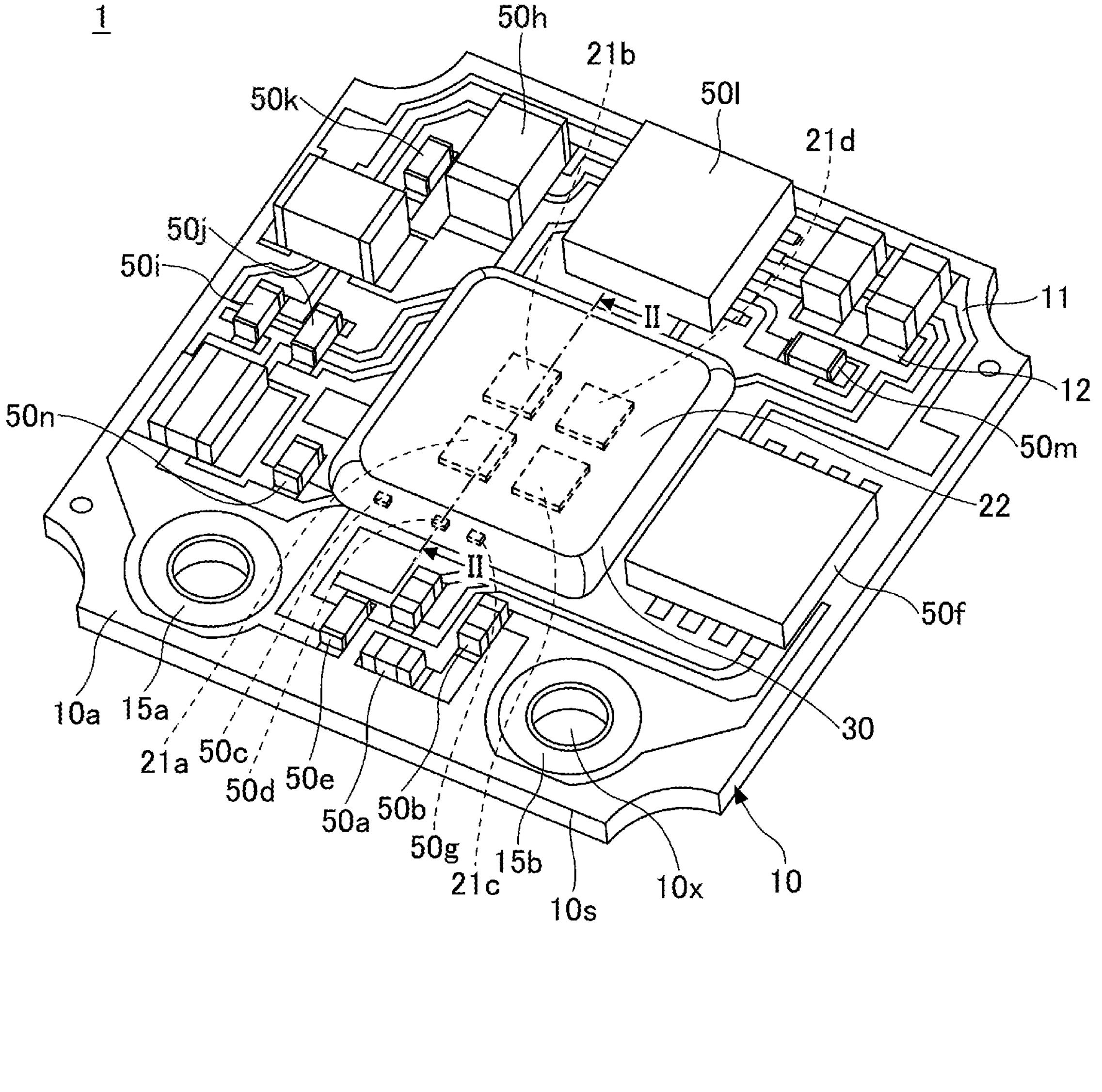
FIG. 1 is a perspective view of a light emitting device according to a first embodiment.

In the following, certain embodiments of the present invention will be described with reference to the accompanying drawings. In the following description, terms indicating specific directions and positions (for example, "upper," "lower," and other terms including or related to these terms) are used as necessary. These terms are used to facilitate understanding of the present invention with reference to the drawings, and the technical scope of the present invention is not limited by the meaning of these terms. The same reference numerals appearing in a plurality of drawings refer to the same, equivalent, or similar portions or members.

Further, the following embodiments exemplify a light emitting device and the like to embody the technical ideas of the present invention, and the present invention is not limited to the following description. In addition, unless otherwise specified, the dimensions, materials, shapes, relative arrangements, and the like of components described below are not intended to limit the scope of the present in vention thereto, but are described as examples. The contents described in one embodiment can be applied to other embodiments and modifications. The sizes, positional relationships, and the like of members illustrated in the drawings may be exaggerated for clearer illustration. Furthermore, in order to avoid excessive complication of the drawings, a schematic view in which some elements are not illustrated may be used, or an end view illustrating only a cut surface may be used as a cross-sectional view. As used herein, the term "rectangular shape" includes a variation of ±5 degrees in each of the four 90-degree corners. In addition, the term "rectangular shape" encompasses shapes similar to rectangular shapes, such as rectangular shapes whose corners are chamfered, rounded, and the like.

First Embodiment

Figure 2:
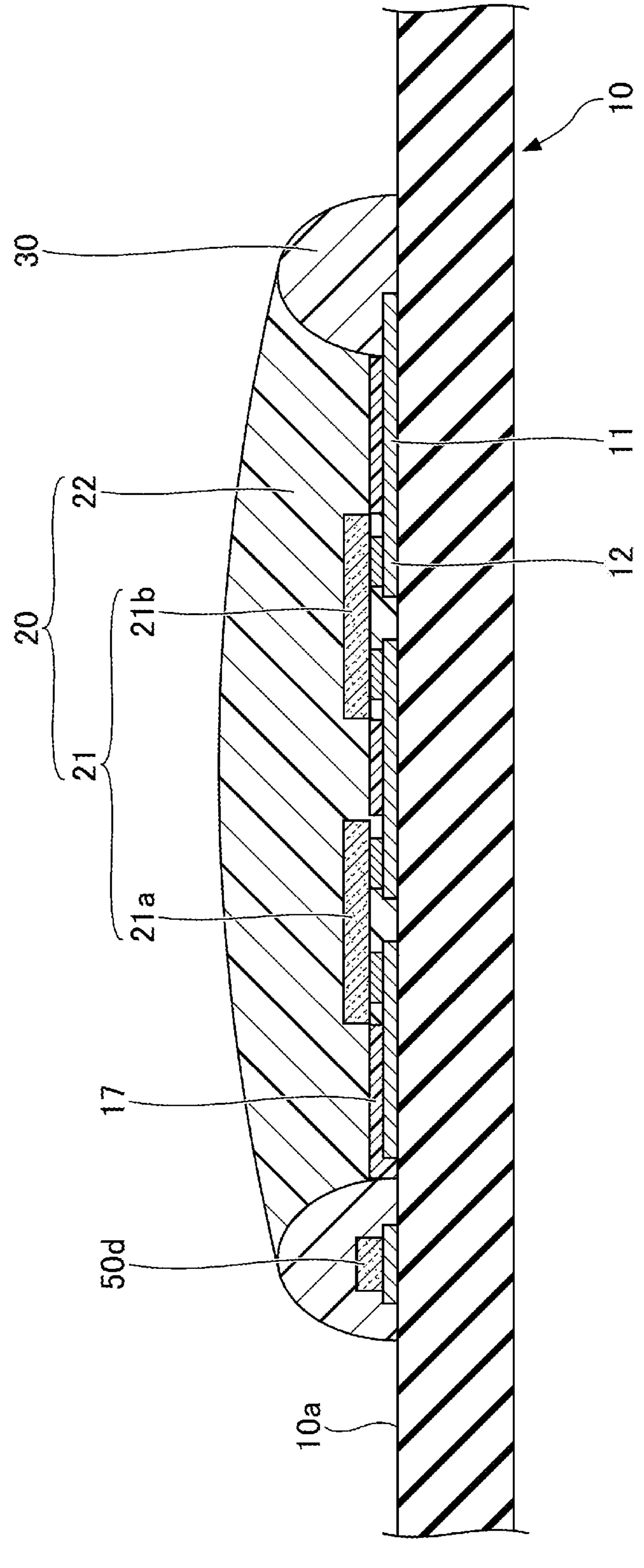
FIG. 2 is a partial cross-sectional view of the light emitting device taken through II-II of FIG. 1.
Figure 3:
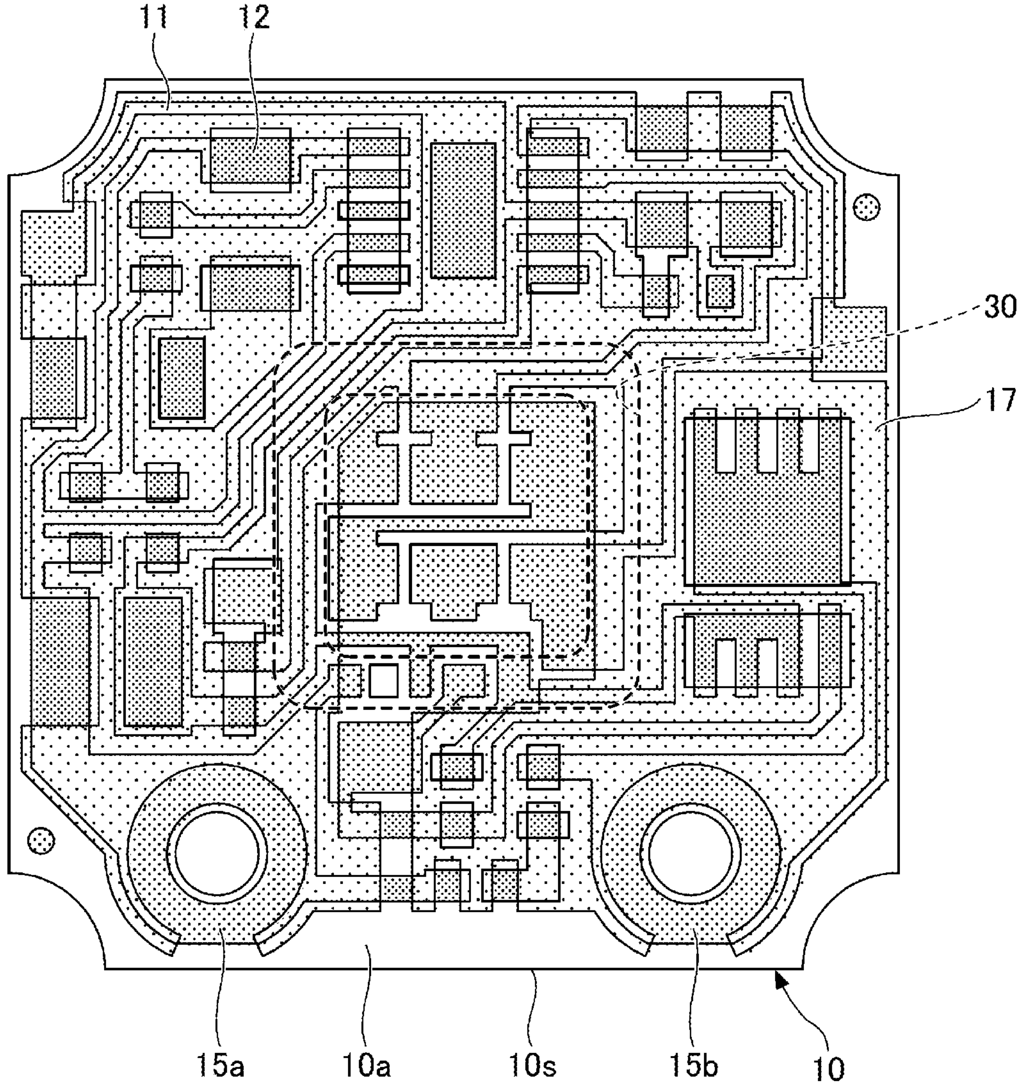
FIG. 3 is a plan view of a substrate of the light emitting device according to the first embodiment.
Figure 4:
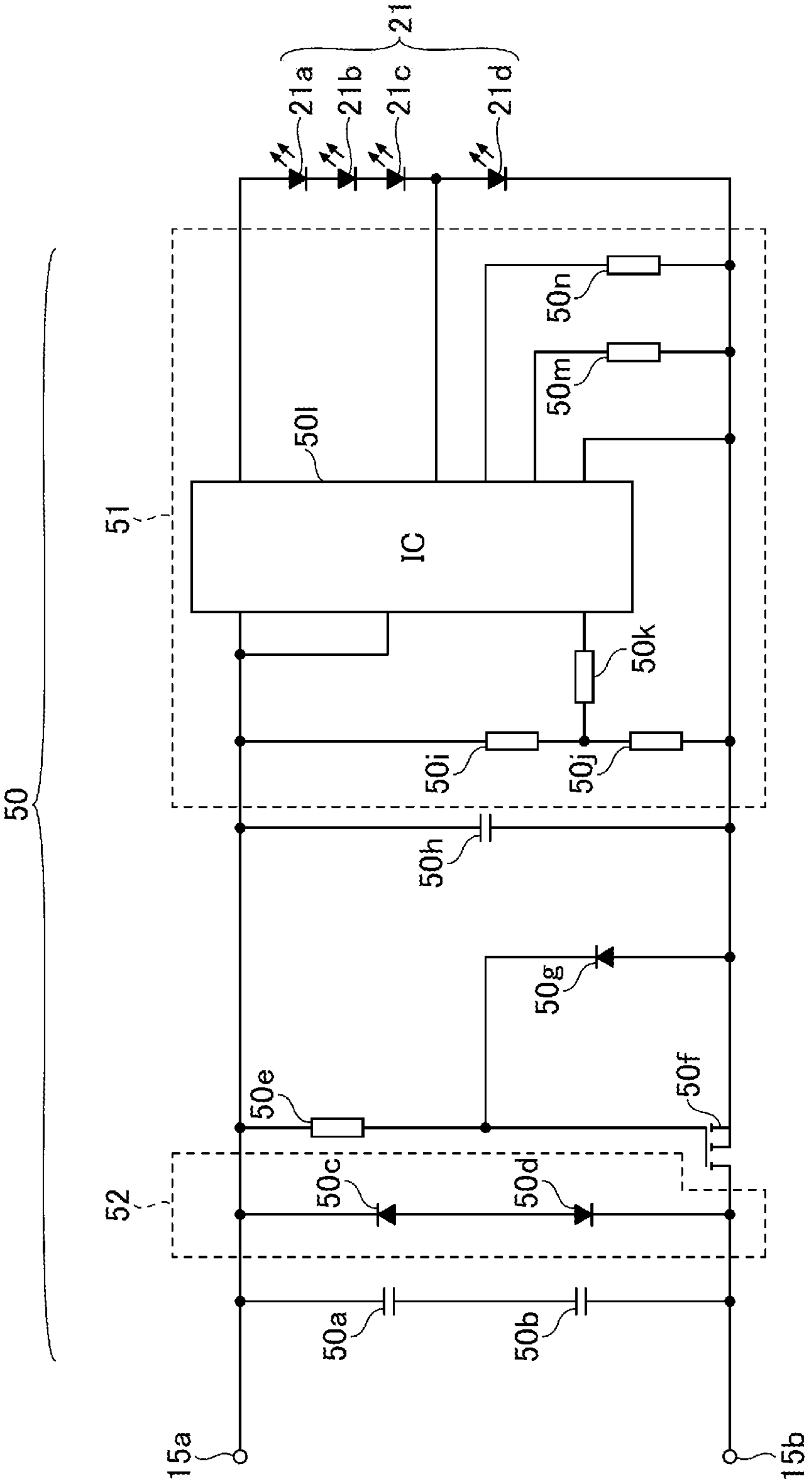
FIG. 4 is a circuit diagram of the light emitting device according to the first embodiment.
Figure 5:
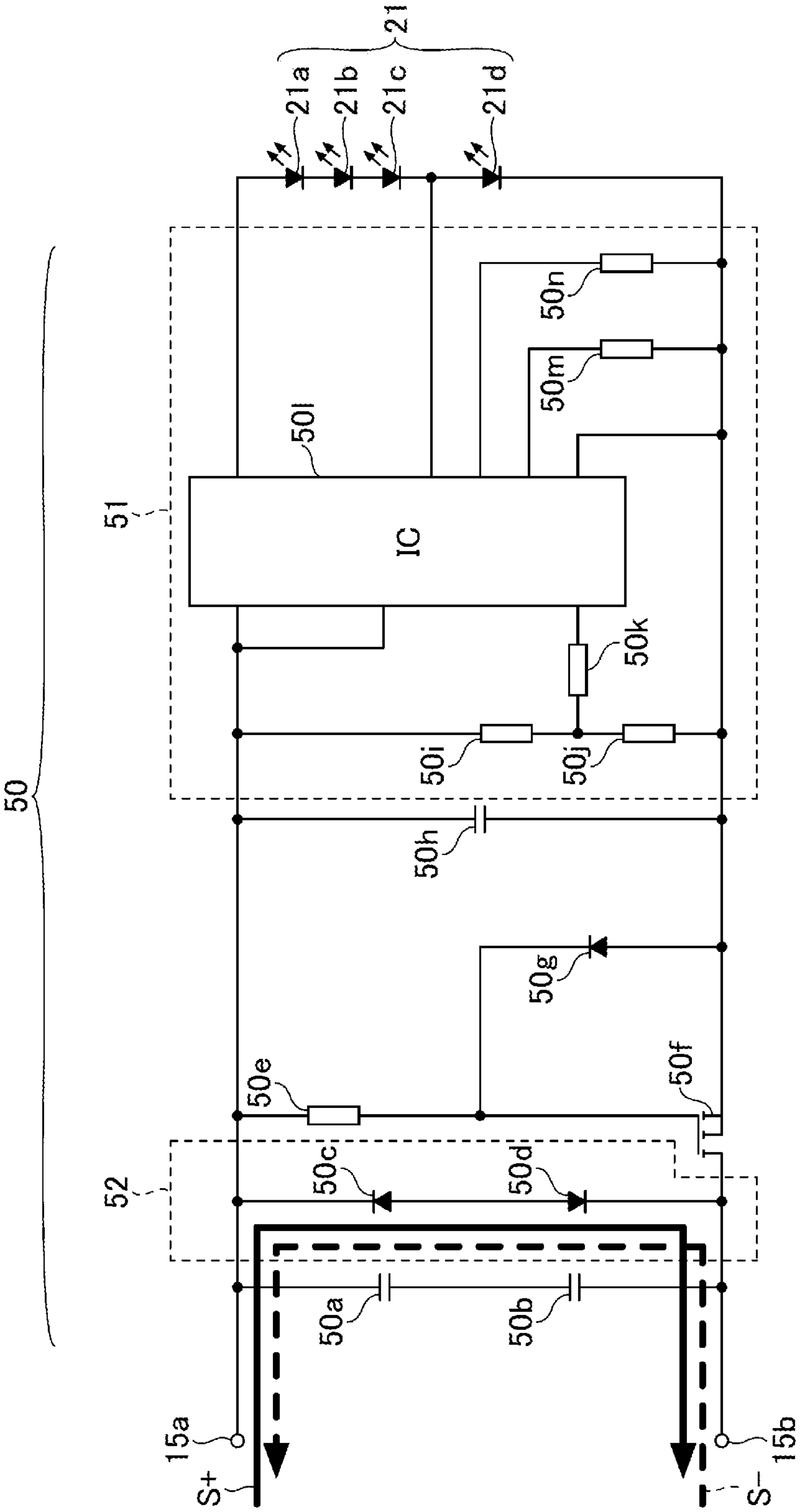
FIG. 5 is a diagram illustrating the flow of a positive surge and a negative surge in the light emitting device according to the first embodiment.

FIG. 1 is a perspective view of a light emitting device according to a first embodiment. FIG. 2 is a partial cross-sectional view of the light emitting device taken through II-II of FIG. 1. FIG. 3 is a plan view of a substrate of the light emitting device according to the first embodiment. FIG. 4 is a circuit diagram of the light emitting device according to the first embodiment. FIG. 5 is a diagram illustrating the flow of a positive surge and a negative surge in the light emitting device according to the first embodiment.

As illustrated in FIG. 1 through FIG. 4, a light emitting device 1 includes a substrate 10, a light source 20, a covering member 30, and a circuit 50. The light source 20, the covering member 30, and the circuit 50 are disposed on the substrate 10. The covering member 30 surrounds the light source and covers a portion of the circuit 50. The light emitting device 1 can be used for in-vehicle lighting devices such as tail lamps, stop lamps, and the like of automobiles, motorbikes, and the like.

The substrate 10 is a flat plate-shaped member having an insulating property. The substrate 10 has a first surface 10*a*. The first surface 10*a* has, for example, a square shape or a rectangular shape. The length of each side of the first surface 10*a* is, for example, approximately 1 cm or more and 3 cm or less. If the first surface 10*a* has a square shape or a rectangular shape, each corner of the square shape or the rectangular shape may be chamfered or the like. The first surface 10*a* may have a circular shape or a polygonal shape.

The substrate 10 is composed of, for example, a ceramic material such as aluminum oxide, aluminum nitride, or silicon nitride. The substrate 10 may be composed of an insulating resin material such as a phenol resin, an epoxy resin, a polyimide resin, a BT resin, or polyphthalamide. The substrate 10 may be a metal member having an insulating member disposed on the surface thereof.

Wiring 11 and component-mounting lands 12 connected to the wiring 11 are disposed on the first surface 10*a* of the substrate 10. Each of the wiring 11 and the lands 12 can be composed of an electrically conductive material such as metal such as gold, silver, copper, or aluminum.

The light emitting device 1 may include a plurality of connection terminals connected to the circuit 50 and disposed along the outer periphery of the first surface 10*a* of the substrate 10 in a plan view. In the example of FIG. 1, two connection terminals 15*a* and 15*b* are disposed along a first side 10*s* of the outer periphery of the first surface 10*a* in a plan view, and are connected to the wiring 11. The first surface 10*a* has a substantially rectangular shape, and the first side 10*s* is one of the sides of the rectangular shape. For example, the connection terminals 15*a* and 15*b* are provided around respective through holes 10*x* extending through the substrate 10.

The connection terminal 15*a* is, for example, a power input terminal, and the connection terminal 15*b* is, for example, a GND terminal. The connection terminals 15*a* and 15*b* can be composed of an electrically conductive material such as metal such as gold, silver, copper, or aluminum. When the light emitting device 1 is mounted in a socket or the like, external plugs (for example, feeding terminals) are inserted into respective ones of the through holes 10*x* and electrically connected to respective ones of the connection terminals 15*a* and 15*b*. Three or more connection terminals may be disposed along the outer periphery of the first surface 10*a* in a plan view.

With the plurality of connection terminals disposed along the outer periphery of the first surface 10*a* as described above, for example, when a heat sink is disposed directly under the light source or an electronic component mounted on the substrate 10, the heat sink and each of the plurality of connection terminals do not easily interfere with each other.

In the light emitting device 1, a solder resist layer 17 that covers the wiring 11 and from which the lands 12 and the connection terminals 15*a* and 15*b* are exposed may be disposed on the first surface 10*a* of the substrate 10. The solder resist layer 17 can be composed of, for example, a photosensitive insulating resin or the like. In FIG. 1, the solder resist layer 17 is not depicted.

The light source 20 is disposed on the first surface 10*a* of the substrate 10. The light source 20 includes, for example, a plurality of light emitting elements 21 and a light transmissive member 22. In the light source 20, the plurality of light emitting elements 21 can be arranged in a matrix so as to have a rectangular light emitting region as a whole in a plan view. In the example of FIG. 1, four light emitting elements 21*a*, 21*b*, 21*c*, and 21*d*, connected in series and each having a rectangular shape in a plan view, are arranged in two rows and two columns so as to have a rectangular shape as a whole in a plan view. Further, the upper surface of the light transmissive member 22 that covers the plurality of light emitting elements 21 has a substantially rectangular shape. With this configuration, the covering member 30 can have a rectangular shape surrounding the light source 20. Therefore, a plurality of electronic components can be efficiency disposed on the first surface 10*a* of the substrate 10 along the covering member 30.

The light emitting elements 21*a* through 21*d* are mounted on component-mounting lands 12. The light emitting elements 21*a* through 21*d* are preferably flip-chip mounted on the substrate 10. In flip-chip mounting, electrodes of the light emitting elements 21*a* through 21*d* can be electrically bonded to the lands 12 on the substrate 10 by using bonding members such as eutectic solder, conductive paste, or bumps.

The light emitting elements 21*a* through 21*d* are, for example, light emitting diodes. The light emitting elements 21*a* through 21*d* can be of any specific configuration as long as the light emitting elements 21*a* through 21*d* can emit light having a predetermined wavelength. For example, each of the light emitting elements 21*a* through 21*d* may be an LED chip housed in a package or may be an LED chip alone (a bare chip). The light emitting elements 21*a* through 21*d* are preferably bare chips that are flip-chip mounted on the substrate 10. Accordingly, the size of the light emitting device 1 can be reduced.

The wavelength of light emitted from the light emitting elements 21*a* through 21*d* is appropriately set according to the application of the light emitting device 1. The plurality of light emitting elements 21 are, for example, blue light emitting elements that emit blue light. In this case, for example, the light emitting elements 21*a* through 21*d* include nitride-based semiconductors ($In_XAl_YGa_{1-X-Y}N$, $0 \leq X$, $0 \leq Y$, $X+Y \leq 1$). When the light emitting elements 21*a* through 21*d* are nitride-based semiconductor light emitting elements configured to emit blue light, the forward current of the light emitting elements 21*a* through 21*d* is, for example, 2.6 V or more.

The light transmissive member 22 is located inward of the outer periphery of the covering member 30 in a plan view, and covers the light emitting elements 21*a* through 21*d*. The upper surface of the light transmissive member 22 is positioned higher than the upper surface of the covering member 30, and constitutes a light emitting surface of the light source 20 (that is, a light emitting surface of the light emitting device 1). The light transmissive member 22 has light transmissivity so as to transmit light emitted from the light emitting elements 21*a* through 21*d*. The light transmissive member 22 includes, for example, a resin. Examples of the resin include known light transmissive resins such as silicone resins and epoxy resins. Among them, a silicone resin having high reliability (specifically, a phenyl silicone resin, a dimethyl silicone resin, or the like) can be preferably used.

The light transmissive member 22 may contain a phosphor. The phosphor is adapted to be excited by light emitted from the light emitting elements 21*a* through 21*d*, and to emit light of a wavelength different from the wavelength of the light emitted from the light emitting elements 21*a* through 21*d*. In one example, when the light emitting elements 21*a* through 21*d* are blue light emitting elements, the light transmissive member 22 may contain a red phosphor. Therefore, red light is emitted from the light emitting surface of the light source 20. Accordingly, the light emitting device 1 configured to emit red light can be obtained.

Examples of the phosphor include yttrium aluminum garnet based phosphors (for example, $(Y,Gd)_3(Al,Ga)_5O_{12}$:Ce), lutetium aluminum garnet based phosphors (for example, $Lu_3(Al,Ga)_5O_{12}$:Ce), terbium aluminum garnet based phosphors (for example, $Tb_3(Al,Ga)_5O_{12}$:Ce), CCA based phosphors (for example, $Ca_{10}(PO_4)_6Cl_2$:Eu), SAE based phosphors (for example, $Sr_4Al_{14}O_{25}$:Eu), chlorosilicate based phosphors (for example, $Ca_8MgSi_4O_{16}Cl_2$:Eu), silicate based phosphors (for example, $(Ba,Sr,Ca,Mg)_2SiO_4$:Eu), oxynitride based phosphors such as β-SiAlON based phosphors (for example, $(Si,Al)_3(O,N)_4$:Eu) and α-SiAlON based phosphors (for example, $Ca(Si,Al)_{12}(O,N)_{16}$:Eu), nitride based phosphors such as LSN based phosphors (for example, $(La,Y)_3Si_6N_{11}$:Ce). BSESN based phosphors (for example, $(Ba,Sr)_2Si_5N_8$:Eu), SLA based phosphors (for example, $SrLiAl_3N_4$:Eu), CASN based phosphors (for example, $CaAlSiN_3$:Eu), and SCASN based phosphors (for example, $(Sr,Ca)AlSiN_3$:Eu), fluoride based phosphors such as KSF based phosphors (for example, $K_2SiF_6$: Mn), KSAF based phosphors (for example, $K_2(Si_{1-x}Al_x)F_{6-x}$: Mn, where x satisfies $0<x<1$), and MGF based phosphors (for example, $3.5MgO{\cdot}0.5MgF_2{\cdot}GeO_2$:Mn), quantum dots having a Perovskite structure (for example, $(Cs,FA,MA)(Pb,Sn)(F,Cl,Br,I)_3$, where FA and MA represent formamidinium and methylammonium, respectively), II-VI quantum dots (for example, CdSe), III-V quantum dots (for example, InP), and quantum dots having a chalcopyrite structure (for example, $(Ag,Cu)(In,Ga)(S,Se)_2$).

The covering member 30 is disposed on the first surface 10*a* of the substrate 10, and surrounds the light source 20 in a plan view. That is, the light emitting elements 21*a* through 21*d* and the light transmissive member 22 are surrounded by the covering member 30 in a plan view. In other words, a region surrounded by the covering member 30 is the light emitting surface of the light emitting device 1, and the light emitting surface of the light emitting device 1 is defined by the covering member 30. The covering member 30 has a frame shape surrounding the light source 20 in a plan view. For example, the covering member 30 may have a rectangular frame shape or a circular frame shape surrounding the light source 20 in a plan view. A portion of the light transmissive member 22 may extend over the covering member 30. The width between the outer edge and the inner edge of the covering member 30 can be approximately 0.5 mm or more and 1 mm or less in a plan view.

The covering member 30 preferably has a light shielding property. The covering member 30 includes, for example, a resin. In order to have a light shielding property, a resin obtained in which a pigment is added to any of the light transmissive resins described above as examples of a material of the light transmissive member 22 can be used for the covering member 30. In order to increase light reflectivity, a filler such as a white pigment may be added to the resin of the covering member 30. As the filler, titanium oxide, aluminum oxide, zinc oxide, barium carbonate, barium sulfate, boron nitride, aluminum nitride, a glass filler, or the like can be suitably used. Further, the covering member 30 may also contain a black pigment such as carbon black, graphite, or titanium black.

The circuit 50 is disposed on the substrate 10. Specifically, the circuit 50 includes the wiring 11 and electronic components 50*a* through 50*n*. Each of the electronic components 50*a* through 50*n* of the circuit 50 is mounted on a corresponding one of the component-mounting lands 12. Each electrode of each of the electronic components 50*a* through 50*n* may be connected to a corresponding one of component-mounting lands 12 by solder or the like or via bonding wires. The circuit 50 may include electronic components other than the electronic components 50*a* through 50*n*.

As illustrated in FIG. 4, the circuit 50 includes a drive circuit 51 configured to drive the light source 20 (specifically, the light emitting elements 21), and includes a protection circuit 52 configured to protect the drive circuit 51 and the light emitting elements 21. In the example of FIG. 4, the drive circuit 51 is constituted of the electronic components 50*i* through 50*n*.

The electronic component 501 is an integrated circuit configured to drive the light-emitting elements 21*a* through 21*d*. The light-emitting elements 21*a* through 21*d* are connected in series to the output side of the electronic component (integrated circuit) 501. Preferably, a voltage is supplied from the outside to the electronic component 501 without an active element (for example, a rectifier diode or the like) that causes a voltage drop. As a result, more of the voltage supplied from the outside can be used to drive the light emitting elements 21*a* through 21*d*. If the light emitting elements 21*a* through 21*d* are blue light emitting diodes, the forward voltage is relatively high. Therefore, supplying the voltage from the outside to the electronic component 501 without an active element has a great significance. Inclusion of the integrated circuit as the electronic component 501 allows the drive circuit 51 to control the value of a current flowing through the light emitting elements 21*a* through 21*d*.

The electronic components 50*i* through 50*k* are resistors configured to set the operating voltage of the electronic component 501. The electronic component 50*m* is a resistor configured to set the output current of the electronic component 501. The electronic component 50*n* is a thermistor configured to detect the ambient temperature of the electronic component 501. The electronic component 501 can control the value of the current flowing through the light emitting elements 21*a* through 21*d* based on the temperature detected by the electronic component 50*n* when the temperature of the substrate 10 rises.

The plurality of light emitting elements 21 may include one or more first light emitting elements and a second light emitting element connected in series with the first light emitting element, and the first light emitting element and the second light emitting element may be connected in parallel to the electronic component 501 (that is, the integrated circuit). In the example of FIG. 4, each of the light emitting elements 21*a* through 21*c* connected in series corresponds to the one or more first light emitting elements, and the light emitting element 21*d* connected in series with the light emitting elements 21*a* through 21*c* corresponds to the second light emitting element.

The drive circuit 51 may have a first operation mode in which the one or more first light emitting elements and the second light emitting element (for example, all the light emitting elements 21*a* through 21*d* connected in series) emit light simultaneously, and a second operation mode in which only the one or more first light emitting elements (for example, the light emitting elements 21*a*, 21*b*, and 21*c* connected in series) emits light. For example, the second operation mode is effective when a voltage applied between the connection terminal 15*a* and the connection terminal 15*b* drops and driving the four light emitting elements simultaneously is difficult.

The drive circuit 51 may include the integrated circuit, but is not required to include the integrated circuit. When the drive circuit 51 includes the integrated circuit, a large current can be supplied to the light emitting elements 21. Thus, the emission intensity of the light emitting elements 21 can be increased. When it is not necessary to increase the emission intensity of the light emitting elements 21, the drive circuit 51 may include a transistor instead of the integrated circuit, or may be configured to apply, to the light emitting elements 21, the voltage supplied from the outside via a resistor.

The protection circuit 52 includes two protection elements connected in series with reversed polarities, and is connected in parallel to the drive circuit 51. The protection circuit 52 is disposed on the input side of the drive circuit 51. The protection elements protect the electronic component 501, the light emitting elements 21, and the like from excessive voltage. In the example of FIG. 4, the electronic components 50*c* and 50*d* are the protection elements. The protection elements 50*c* and 50*d* are connected in series with reversed polarities between the connection terminal 15*a* and the connection terminal 15*b*.

The protection elements may be diodes, and are preferably Zener diodes. For the sake of reducing the size of the light emitting device 1, the protection elements are preferably bare chips. When the protection elements are bare chips, the protection elements can be easily covered by the covering member 30. When the protection elements are bare chips, the protection elements may each be in the form of a rectangular parallelepiped or a cube in which the length of one side is approximately 0.1 mm or more and 0.3 mm or less. When the protection elements are Zener diodes, the range of Zener voltage is preferably approximately 16 volts (V) to 40 V in consideration of supplying the voltage required to drive the light emitting elements 21 to the drive circuit 51 and protecting the drive circuit 51 and the light emitting elements 21 from excessive voltage.

The circuit 50 may further include circuits other than the drive circuit 51 and the protection circuit 52 as necessary. In the example of FIG. 4, the circuit 50 includes the electronic components 50*a*, 50*b*, and 50*e* through 50*h* in addition to the drive circuit 51 and the protection circuit 52.

The electronic components 50*a* and 50*b* are capacitors for noise suppression, and are connected in series between the connection terminal 15*a* and the connection terminal 15*b*. The electronic components 50*a* and 50*b* can reduce, for example, radio noise, noise induced in cables, and the like. The electronic components 50*a* and 50*b* are located closer to the input side than the electronic components 50*c* and 50*d* are. As used herein, the "input side" refers to a side closer to the connection terminals 15*a* and 15*b*, and the "output side" refers to a side closer to the light emitting elements 21*a* through 21*d*.

The electronic components 50*e* through 50*g* constitute a reverse connection protection circuit, and are connected to the output side of the electronic components (capacitors) 50*c* and 50*d*. The electronic component 50*e* is a resistor, and controls the value of the current flowing through the electronic component 50*f*. The electronic component 50*f* is a metal-oxide-semiconductor field-effect transistor (MOSFET), and prevents the current from flowing from the connection terminal 15*b* to the connection terminal 15*a*. The electronic component 50*g* is a Zener diode, and protects the voltage applied to the electronic component (resistor) 50*e* side of the electronic component (MOSFET) 50*f* from exceeding the maximum rating when the current is caused to flow from the connection terminal 15*a* to the connection terminal 15*b*.

One end of the electronic component (resistor) 50*e* is electrically connected to the connection terminal 15*a*, and the other end of the electronic component (resistor) 50*e* is electrically connected to a gate of the electronic component 50*f* and to a cathode of the electronic component (Zener diode) 50*g*. Further, a source of the electronic component 50*f* is electrically connected to the connection terminal 15*b*, and an anode of the electronic component (Zener diode) 50*g* is electrically connected to a drain of the electronic component (MOSFET) 50*f*. In this circuit, the gate of the electronic component (MOSFET) 50*f* is biased. Therefore, a voltage drop between the drain and the source of the electronic component (MOSFET) 50*f* can be reduced, and thus, the reverse connection protection circuit that reduces voltage consumption can be provided.

The electronic component 50*h* is a capacitor for noise suppression, and is connected between the connection terminal 15*a* and the connection terminal 15*b*. The electronic component (capacitor) 50*h* is located closer to the output side than the electronic components 50*e* through 50*g* (reverse connection protection circuit) are, and is located closer to the input side than the drive circuit 51 is.

The circuit configuration illustrated in FIG. 4 is one example, and the light emitting device 1 may have other circuit configuration. The light emitting device 1 may have other appropriate circuit configuration depending on the application or the like of the light emitting device 1.

In the circuit 50, the voltage of approximately a few volts to a dozen or so volts is usually applied between the connection terminal 15*a* and the connection terminal 15*b* from a power source. However, there may be a case where a pulse voltage or the like exceeding 100 V is applied between the connection terminal 15*a* and the connection terminal 15*b*.

For example, if the light emitting device 1 is used for a lighting device of an automobile, the connection terminals 15*a* and 15*b* are connected to a battery and an alternator. If the connection between the connection terminals 15*a* and 15*b* and the battery is disconnected while the alternator is connected to another voltage load, a positive surge exceeding 100 V that is more positive than 0 V may be applied. Alternatively, if the polarity of the battery is reversely connected when maintenance of an automobile or the like is performed, a negative surge exceeding 100 V that is more negative than 0 V may be applied.

In this case, if the circuit 50 does not include the protection circuit constituted of the electronic components 50*c* and 50*d*, a positive surge and a negative surge would flow to the drive circuit 51, and as a result, the electronic component (integrated circuit) 501, the light emitting elements 21, and the like would be destroyed. In contrast, the light emitting device 1 according to the present embodiment includes the protection circuit constituted of the electronic components 50*c* and 50*d*. Therefore, as indicated by a solid line in FIG.

5, most of a positive surge S+ flows from the connection terminal 15*a* to the connection terminal 15*b* through the electronic components 50*c* and 50*d*. In addition, as indicated by a dashed line in FIG. 5, most of a negative surge S− flows from the connection terminal 15*b* to the connection terminal 15*a* through the electronic components 50*c* and 50*d*. Therefore, excessive voltage, which may cause the electronic component 501, the light emitting elements 21 and the like to be destroyed, is not applied to the output side of the electronic components 50*c* and 50*d*. Accordingly, the electronic component 501, the light emitting elements 21 and the like can be protected from excessive voltage.

The light emitting device 1 is preferably small in consideration of being mounted in a vehicle such as an automobile. If the electronic components 50*c* and 50*d*. which are the protection elements, are located outward of the covering member 30 in a plan view, the area of the first surface 10*a* of the substrate 10 would need to be increased, thereby increasing the size of the light emitting device 1. In light of this, as illustrated in FIG. 1 and FIG. 2. in the light emitting device 1 according to the embodiment, the electronic components 50*c* and 50*d* constituting the protection circuit are arranged in the surroundings of the light source 20 and are covered by the covering member 30. Accordingly, the size of the light emitting device 1 can be the same regardless of whether the light emitting device 1 includes the protection circuit. From the viewpoint of reducing the size of the light emitting device 1, the electronic components 50*c* and 50*d* are preferably bare chips.

Figure 6:
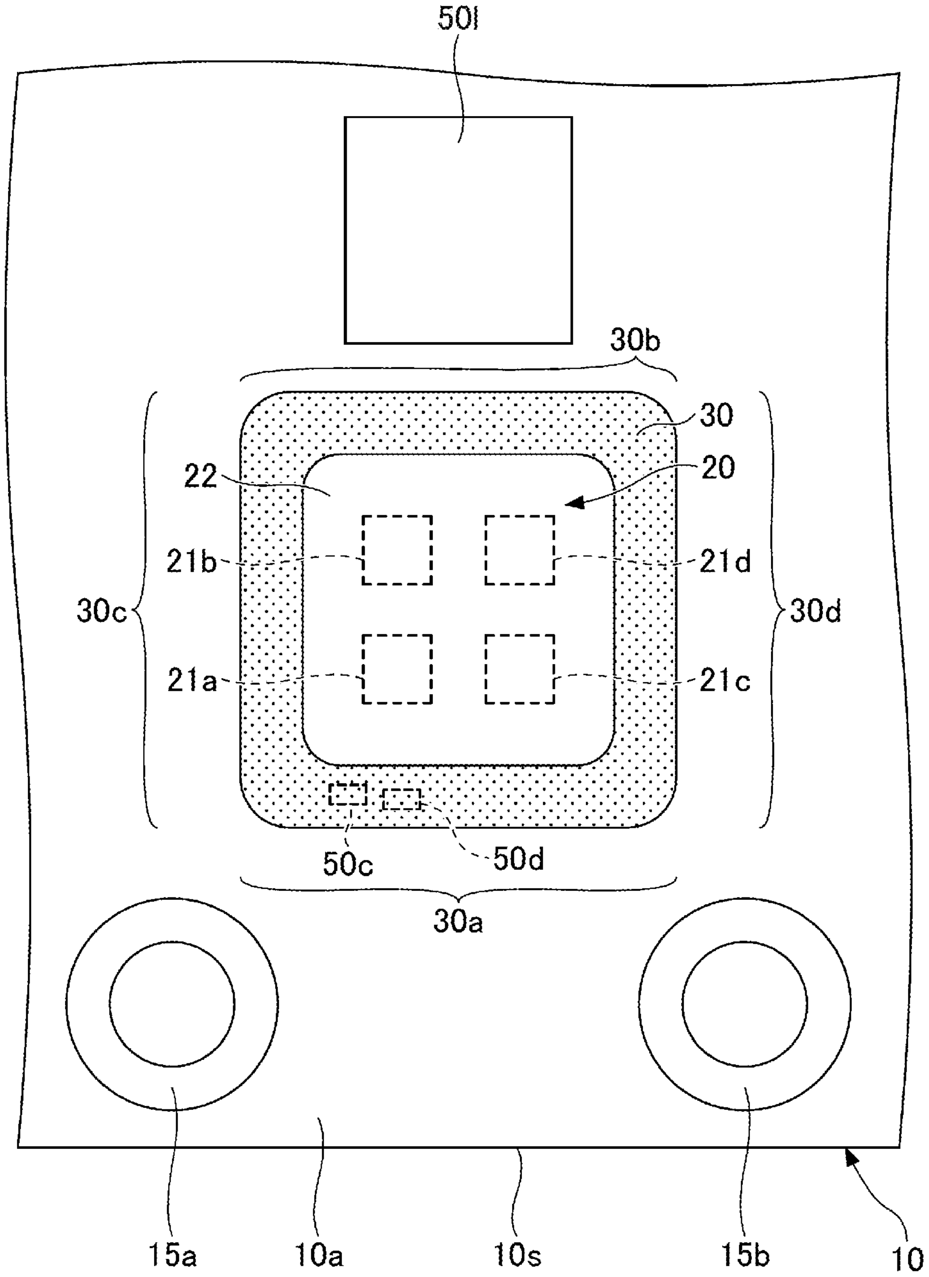
FIG. 6 is a plan view illustrating a covering member and its vicinity.

FIG. 6 is a plan view illustrating the covering member and its vicinity. As illustrated in FIG. 6, the connection terminals 15*a* and 15*b* are disposed along the first side 10*s* of the outer periphery of the first surface 10*a*, and the covering member 30 is provided in a rectangular frame shape surrounding the light source 20 in a plan view. The covering member 30 has a first region 30*a*, a second region 30*b*, a third region 30*c*, and a fourth region 30*d*. The first region 30*a* extends parallel to the first side 10*s*, and is located at a side near to the connection terminals 15*a* and 15*b*, the second region 30*b* extends parallel to the first side 10*s*, and is located at a side far from the connection terminals 15*a* and 15*b*, the third region 30*c* connects one end of the first region 30*a* and one end of the second region 30*b*, and the fourth region 30*d* connects another end of the first region 30*a* and another end of the second region 30*b*.

The electronic components 50*c* and 50*d* constituting the protection circuit are preferably disposed in one or more of the first region 30*a*, the third region 30*c*, and the fourth region 30*d*. With this configuration, wiring from the connection terminals 15*a* and 15*b* to the electronic components 50*c* and 50*d* can be shortened, that is, a region where positive and negative surges flow can be shortened. The electronic components 50*c* and 50*d*, which are the protection elements, are preferably disposed only in the first region 30*a*. Accordingly, a region where positive and negative surges flow can be further shortened.

Further, the electronic component 501, which is the integrated circuit, has a rectangular shape in a plan view, and is preferably disposed near the covering member 30 such that one side of the rectangular shape of the electronic component 501 is located along the outer periphery of the covering member 301. With this arrangement, the rectangular-shaped electronic component 501 can be efficiency disposed on the small-area first surface 10*a* along the covering member 30. That is, the area of the first surface 10*a* of the substrate 10 can be reduced. The electronic component 501, which is the integrated circuit, is preferably disposed along the second region 30*b* of the covering member 30. With this arrangement, the electronic component 501 is located farther from the connection terminals 15*a* and 15*b*, so that effects of positive and negative surges can be further reduced.

The light emitting device 1 can be manufactured by the following method. First, the substrate 10 having the first surface 10*a* on which the wiring 11, the lands 12, and the connection terminals 15*a* and 15*b* are formed is provided. For example, a base or the like, serving as the substrate 10, is provided, and then the wiring 11, the lands 12, and the connection terminals 15*a* and 15*b* are formed on the first surface 10*a* of the base or the like by photolithography or the like. Alternatively, the substrate 10 may be provided by purchasing the substrate 10 with the wiring 11, the lands 12, and the connection terminals 15*a* and 15*b* formed on the first surface 10*a*.

Next, the light emitting elements 21*a* through 21*d* and the electronic components 50*a* through 50*n* are mounted on the lands 12 on the first surface 10*a* of the substrate 10. Next, the covering member 30 is formed by supplying an uncured resin material onto the first surface 10*a* of the substrate 10 to surround the light emitting elements 21*a* through 21*d* and to cover at least the electronic components 50*c* and 50*d*, and curing the uncured resin material.

The covering member 30 is formed by, for example, placing a needle of a resin discharging device above the substrate 10, and moving the needle while discharging an uncured resin material onto the substrate 10 from the tip of the needle. The uncured resin material discharged from the needle wets and spreads over the substrate 10. As a result, the covering member 30 having a substantially semicircular shape or a substantially semielliptical shape in a cross-sectional view is formed.

Next, the light transmissive member 22 is formed by supplying an uncured light-transmissive resin material onto the first surface 10*a* of the substrate 10 exposed within the covering member 30, and curing the uncured light-transmissive resin material. Thus, the light emitting elements 21*a* through 21*d* are sealed by the light transmissive member 22. In this manner, the light emitting device 1 is obtained. Before the light transmissive member 22 is formed, the first surface 10*a* exposed from the light emitting elements 21*a* through 21*d* may be covered by a reflective member. Accordingly, absorption of light, emitted from the light emitting elements 21*a* through 21*d*, into the substrate 10 can be decreased, and thus, the light emitting device 1 having higher light extraction efficiency can be obtained.

Second Embodiment

Figure 7:
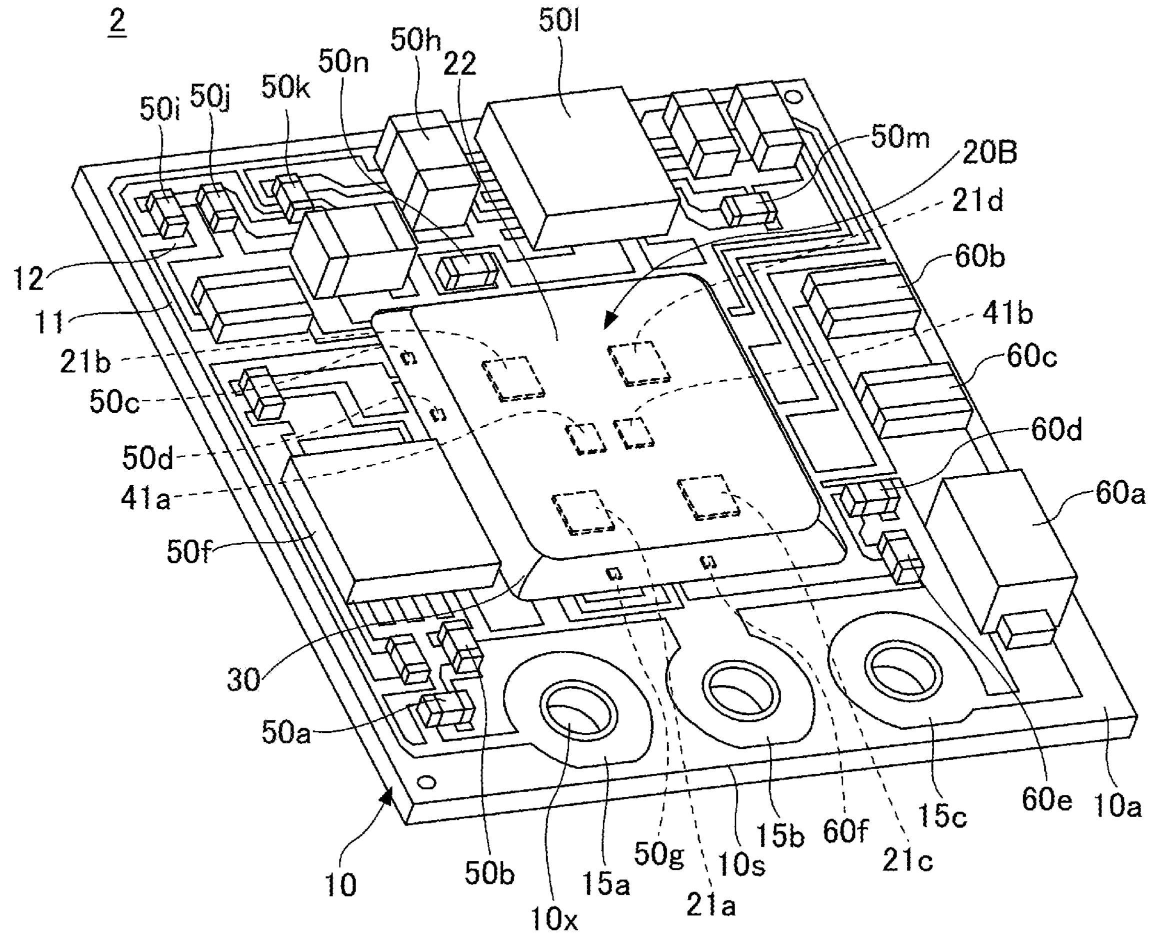
FIG. 7 is a perspective view of a light emitting device according to a second embodiment.
Figure 8:
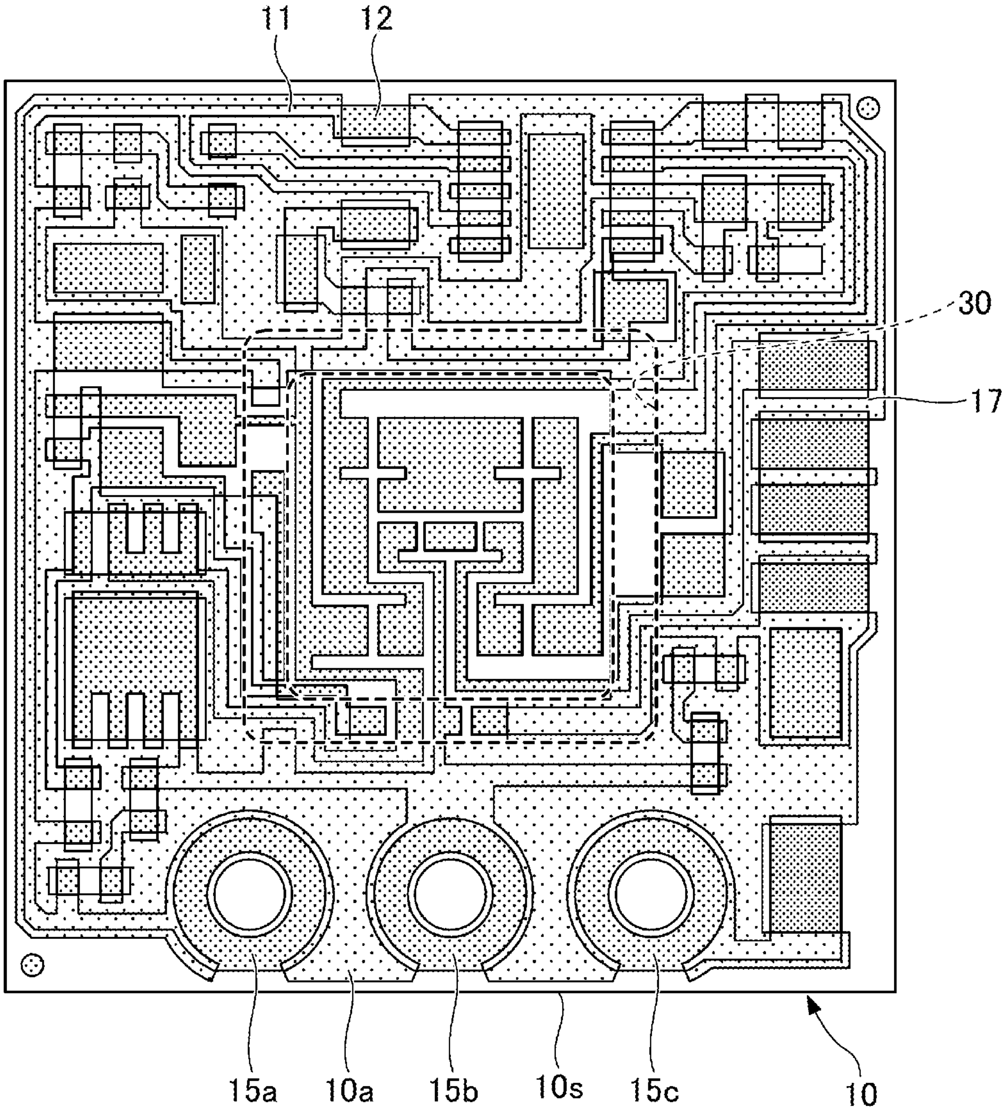
FIG. 8 is a plan view of the light emitting device according to the second embodiment.
Figure 9:
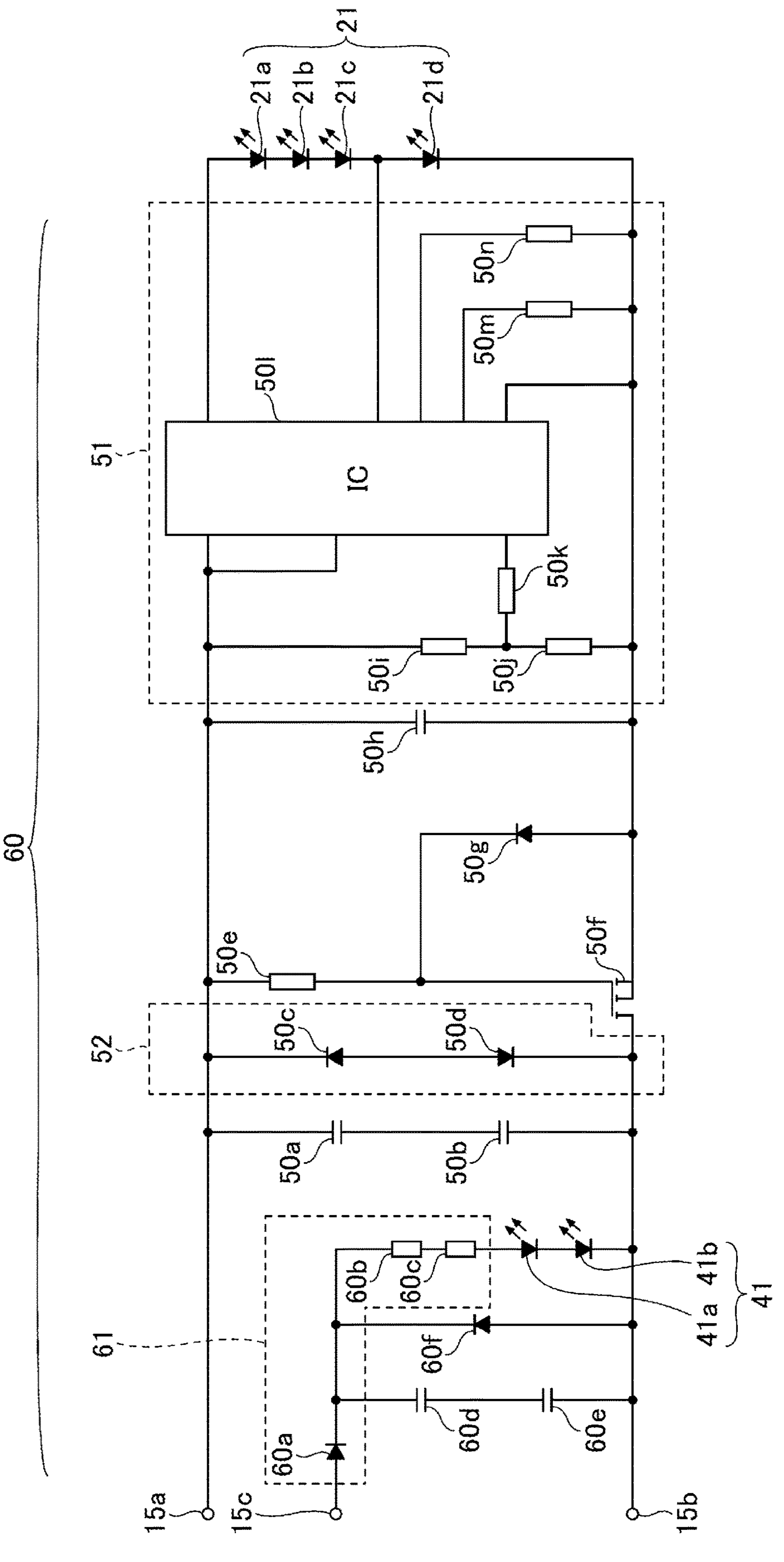
FIG. 9 is a circuit diagram of the light emitting device according to the second embodiment.

In a second embodiment, an example of a light emitting device including two drive circuits will be described. FIG. 7 is a perspective view of a light emitting device according to the second embodiment. FIG. 8 is a plan view of the light emitting device according to the second embodiment. FIG. 9 is a circuit diagram of the light emitting device according to the second embodiment.

As illustrated in FIG. 7 through FIG. 9, a light emitting device 2 includes a substrate 10, a light source 20B, a covering member 30, and a circuit 60. The light emitting device 2 can be used for in-vehicle lighting devices such as stop lamps and/or tail lamps of automobiles, motorbikes, and the like.

In the light emitting device 2, the light source 20B includes a first light source and a second light source. The circuit 60 includes a first drive circuit configured to drive the first light source and a second drive circuit configured to drive the second light source. The first drive circuit and the second drive circuit can be driven independently from each other.

In the examples of FIG. 7 through FIG. 9, the first light source includes light emitting elements 21*a* through 21*d* and a light transmissive member 22, and the second light source includes light emitting elements 41*a* and 41*b* and the light transmissive member 22. The light transmissive member 22 collectively covers the first light source and the second light source. Further, a drive circuit 51 is the first drive circuit configured to drive the light emitting elements 21*a* through 21*d* of the first light source. A drive circuit 61 is the second drive circuit configured to drive the light emitting elements 41*a* and 41*b* of the second light source.

As illustrated in FIG. 9, the circuit 60 includes the drive circuit 61 and the drive circuit 51 that has the same configuration as that of the circuit 50 illustrated in FIG. 4. The drive circuit 61 is constituted of electronic components 60*a* through 60*c*. The electronic components 60*a* through 60*c* and the light emitting elements 41*a* and 41*b* are connected in series. The electronic component 60*a* is a rectifier diode, and an anode of the electronic component 60*a* is connected to a connection terminal 15*c*. The electronic component 60*a* can protect against reverse connection and can also protect the light emitting elements 41*a* and 41*b* from a negative surge. The electronic components 60*b* and 60*c* are resistors connected between a cathode of the electronic component 60*a* and the light emitting element 41*a*, and adjust a current flowing through the light emitting elements 41*a* and 41*b*.

As described, the drive circuit 61 does not include an integrated circuit and a transistor, and includes the electronic component 60*a*, which is the rectifier diode, and the electronic components 60*b* and 60*c*, which are the resistors connected to the cathode of the rectifier diode in series. The light emitting elements 41*a* and 41*b* emit light by a current supplied through the electronic component 60*a*, which is the rectifier diode, and the electronic components 60*b* and 60*c*, which are the resistors.

The circuit 60 may include a peripheral circuit of the drive circuit 61 as necessary. In the example of FIG. 9, the circuit 60 includes electronic components 60*d* through 60*f* as the peripheral circuit of the drive circuit 61. The electronic components 60*d* and 60*e* are capacitors for noise suppression, and are connected in series between the connection terminal 15*c* and a connection terminal 15*b*. The electronic components 60*d* and 60*e* can reduce, for example, radio noise, noise induced in cables, and the like. The electronic component 60*f* is a Zener diode for protecting the light emitting elements 41*a* and 41*b* from a positive surge, and are connected in series between the connection terminal 15*c* and the connection terminal 15*b*. The electronic component 60*f* is located closer to the output side than the electronic components 60*d* and 60*e* are.

In the light emitting device 2, the drive circuit 51 and the drive circuit 61 can be driven independently from each other, so that the light emitting elements 21*a* through 21*d* and the light emitting elements 41*a* and 41*b* can emit light simultaneously or emit light at different timings. The light emitting elements 21*a* through 21*d* can be used for, for example, an automotive stop lamp, and the light emitting elements 41*a* and 41*b* can be used for, for example, an automotive tail lamp.

Figure 10:
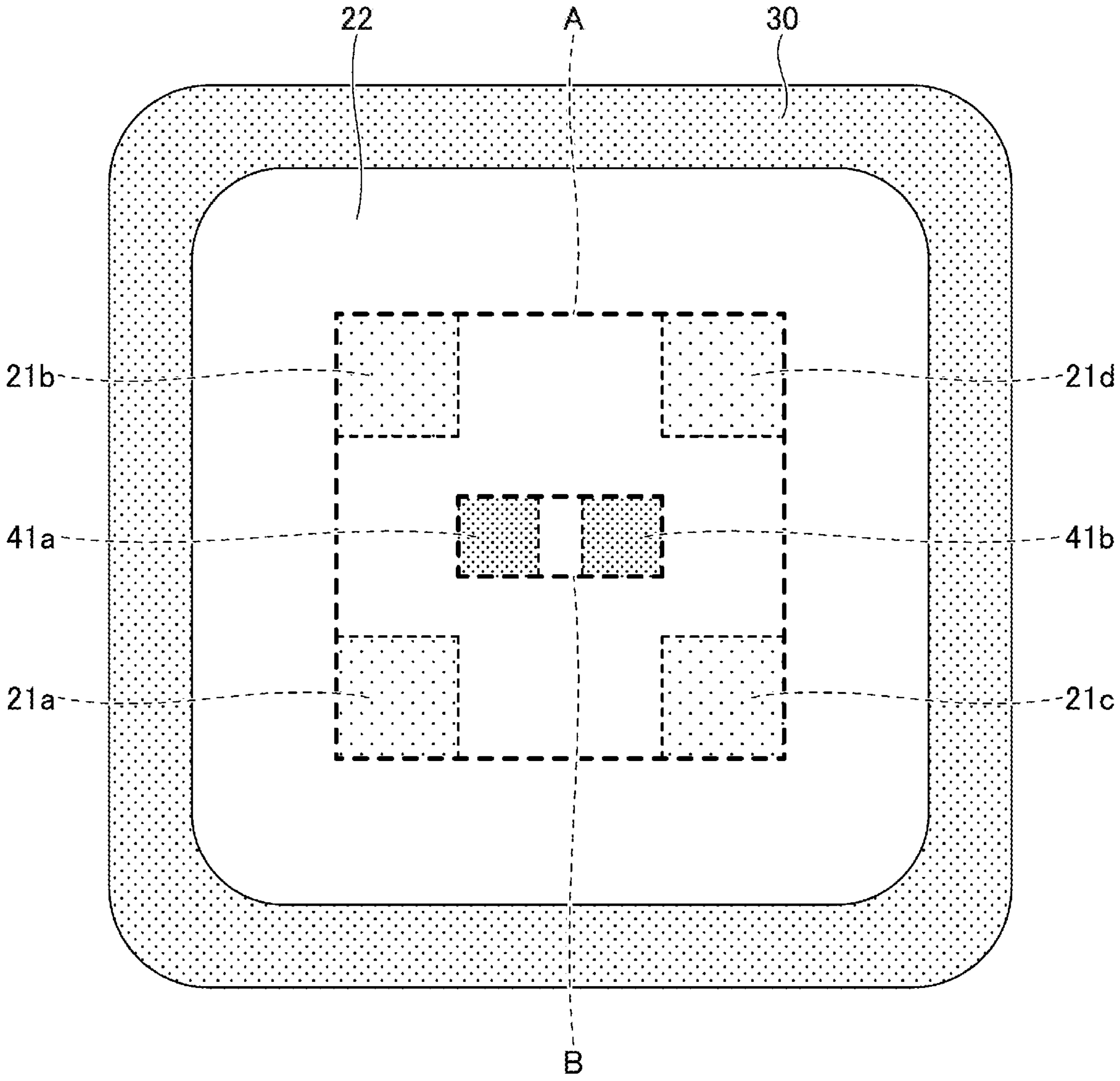
FIG. 10 is a partial plan view illustrating a region surrounded by a covering member of the light emitting device (that is, a light emitting surface of the light emitting device) according to the second embodiment.

FIG. 10 is an enlarged view of FIG. 7, and is a partial plan view illustrating a region surrounded by the covering member 30 of the light emitting device 2 (that is, a light emitting surface of the light emitting device 2) according to the second embodiment. Similar to the first embodiment, the light emitting device 2 includes the covering member 30 that has a rectangular frame shape surrounding the light source 20B. That is, the light source 20B has a light emitting surface having a substantially rectangular shape. The light emitting device 2 includes the plurality of light emitting elements constituting a part of the first light source, and the one or more light emitting elements constituting a part of the second light source. The plurality of light emitting elements 21*a* through 21*d* of the first light source can have substantially the same size and can each have a rectangular shape in a plan view. Further, the one or more (in this example, two) light emitting elements 41*a* and 41*b* of the second light source can have substantially the same size and can each have a rectangular shape in a plan view. In a plan view, each of the light emitting elements 41 of the second light source is smaller than each of the light emitting elements 21 of the first light source. That is, the light emitting area of each of light emitting elements 41 of the second light source is smaller than the light emitting area of each of the light emitting elements 21 of the first light source.

Similarly to the first embodiment, in the light emitting device 2, the plurality of light emitting elements 21 can be arranged in a matrix so as to have a rectangular light emitting region as a whole in a plan view. For example, the plurality of light emitting elements 21 can be arranged in a matrix so as to have, as a whole, a rectangular shape similar to that of the rectangular region surrounded by the covering member 30. In the example of FIG. 10, the light emitting elements 21*a* through 21*d* of the first light source are arranged in a rectangular shape A as a whole in a plan view. Specifically, the light emitting elements 21*a* through 21*d* constituting a part of the first light source are arranged in two rows and two columns such that two sides of the outer periphery of each of the light emitting elements 21*a* through 21*d* overlap a corresponding corner portion of the rectangular shape A indicated by a dashed line.

In the light emitting device 2, the one or more light emitting elements 41 constituting a part of the second light source are disposed within the rectangular shape A. In the example of FIG. 10, the two light emitting elements 41*a* and 41*b* constituting a part of the second light source are disposed within the rectangular shape A. Further, in the light emitting device 2, the one or more light emitting elements 41 of the second light source are arranged in a rectangular shape as a whole in a plan view. In the example of FIG. 10, three sides of the outer periphery of each of the light emitting elements 41*a* and 41*b* overlap a rectangular shape B indicated by a dashed line. Accordingly, the light emitting elements 41*a* and 41*b* of the second light source are arranged in a rectangular shape as a whole in a plan view. In FIG. 10 through FIG. 16, dashed lines indicating rectangular shapes A and rectangular shapes B are virtual lines for convenience of description.

The rectangular shape B is preferably located within the rectangular shape A in a plan view. Further, the center of the rectangular shape A preferably coincides with the center of the rectangular shape B in a plan view. With this configuration, the center of emission of the light emitting elements 21 constituting a part of the first light source and the center of emission of the light emitting elements 41 constituting a part of the second light source can coincide with each other. Accordingly, an optical system such as a lens can be easily designed.

As described above, the light emitting device according to the second embodiment includes the drive circuit 51 and the drive circuit 61 that can be driven independently from each other. The drive circuit 51 is configured to drive the first light source, and the drive circuit 61 is configured to drive the second light source. The light emitting elements 21 constituting a part of the first light source and the light emitting elements 41 constituting a part of the second light source are collectively covered by the light transmissive member 22. Accordingly, the light emitting device 2 can emit an appropriate amount of light for a tail lamp and an appropriate amount of light for a stop lamp by switching between the driving circuits. In general, the amount of light required for an automotive stop lamp is five times or more the amount of light required for an automotive tail lamp.

If the light emitting elements 21 constituting a part of the first light source is used for an automotive stop lamp and the light emitting elements 41 constituting a part of the second light source is used for an automotive tail lamp, the amount of light required for the tail lamp may be one-fifth or less of the amount of light required for the stop lamp. Therefore, as illustrated in FIG. 10, the light emitting area of the one or more light emitting elements 41 constituting a part of the second light source can be smaller than the light emitting area of the light emitting elements 21 constituting a part of the first light source. Further, by disposing the small second light source to be located inward of the large first light source, the first light source and the second light source can be easily arranged, and also the light emitting area of the light emitting device can be reduced. By reducing the light emitting area of the light emitting device, a lens can be easily designed, and design variations of an optical system can be increased.

Figure 11:
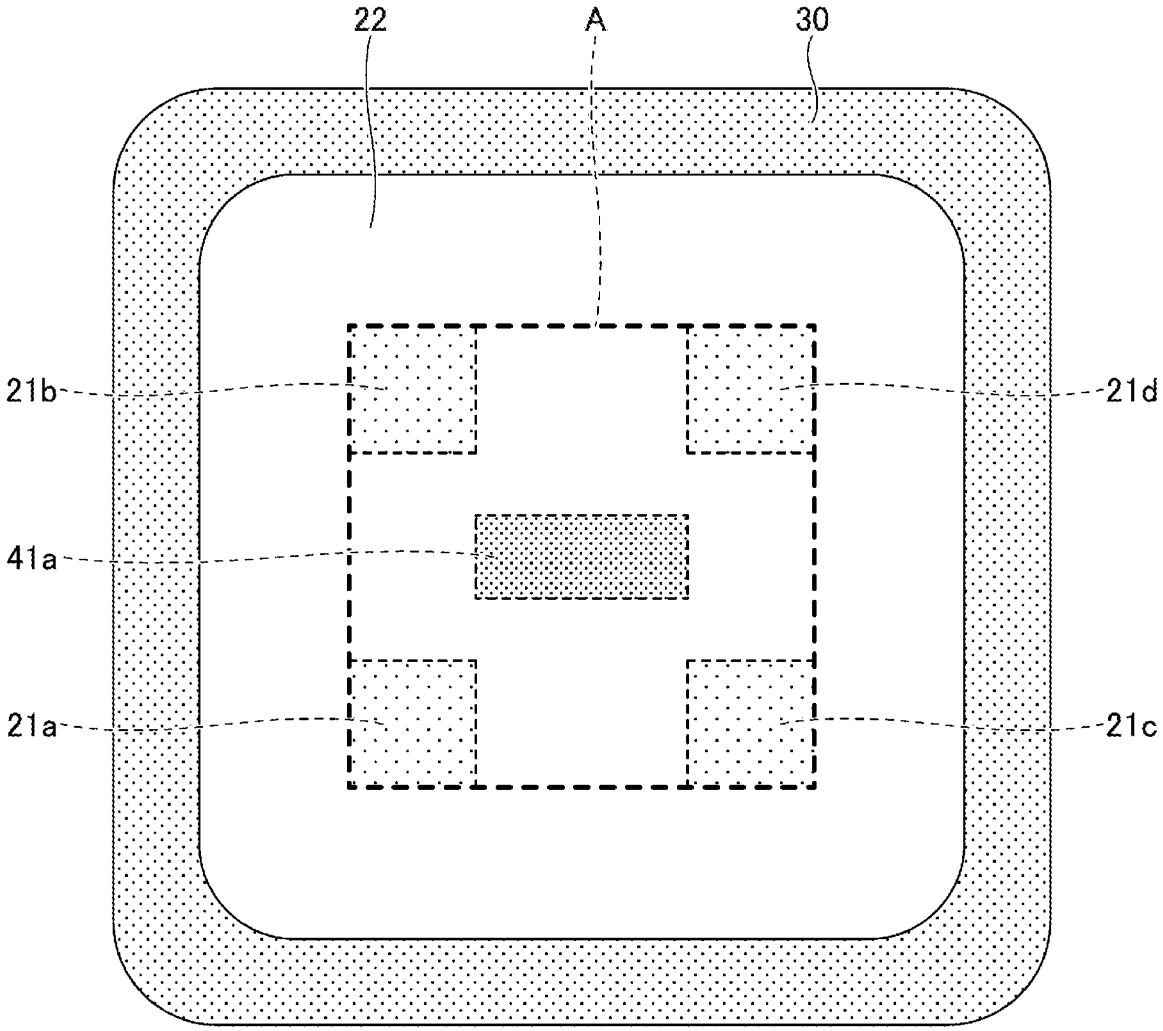
FIG. 11 is a partial plan view illustrating a modification of the light emitting surface of the light emitting device (that is, the region surrounded by the covering member) according to the second embodiment.
Figure 12:
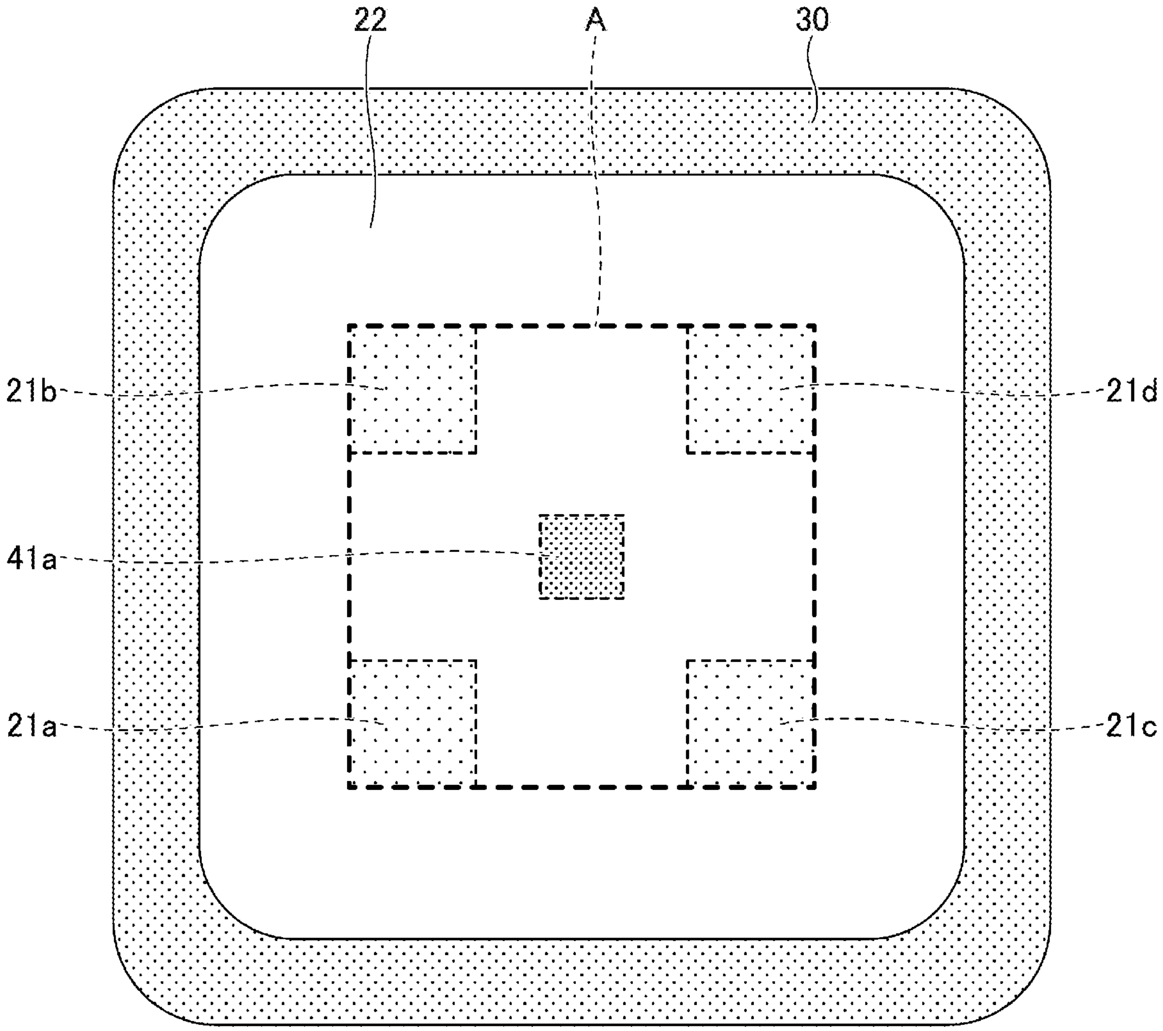
FIG. 12 is a partial plan view illustrating a modification of the light emitting surface of the light emitting device (that is, the region surrounded by the covering member) according to the second embodiment.

FIG. 11 through FIG. 15 are partial plan views illustrating modifications of the light emitting surface of the light emitting device (that is, the region surrounded by the covering member 30) according to the second embodiment. Similarly to the example illustrated in FIG. 10, in each of the modifications illustrated in FIG. 11 and FIG. 12, light emitting elements 21*a* through 21*d* constituting a part of a first light source are arranged such that two sides of the outer periphery of each of the light emitting elements 21*a* through 21*d* overlap a corresponding corner portion of a rectangular shape A indicated by a dashed line. Accordingly, the light emitting elements 21*a* through 21*d* are arranged in a rectangular shape as a whole in a plan view. In addition, at least one light emitting element 41*a* constituting a part of a second light source is disposed within the rectangular shape A. In the example of FIG. 11, one light emitting element 41*a* having a rectangular shape in a plan view is disposed within a rectangular shape A. In the example of FIG. 12, one light emitting element 41*a* having a square shape in a plan view is disposed within a rectangular shape A. In each of the examples illustrated in FIG. 11 and FIG. 12, the light emitting device 2 includes the one light emitting element 41*a* constituting a part of the second light source. In this case, the outer periphery of the light emitting element 41*a* corresponds to the outer periphery of a rectangular shape B.

Figure 13:
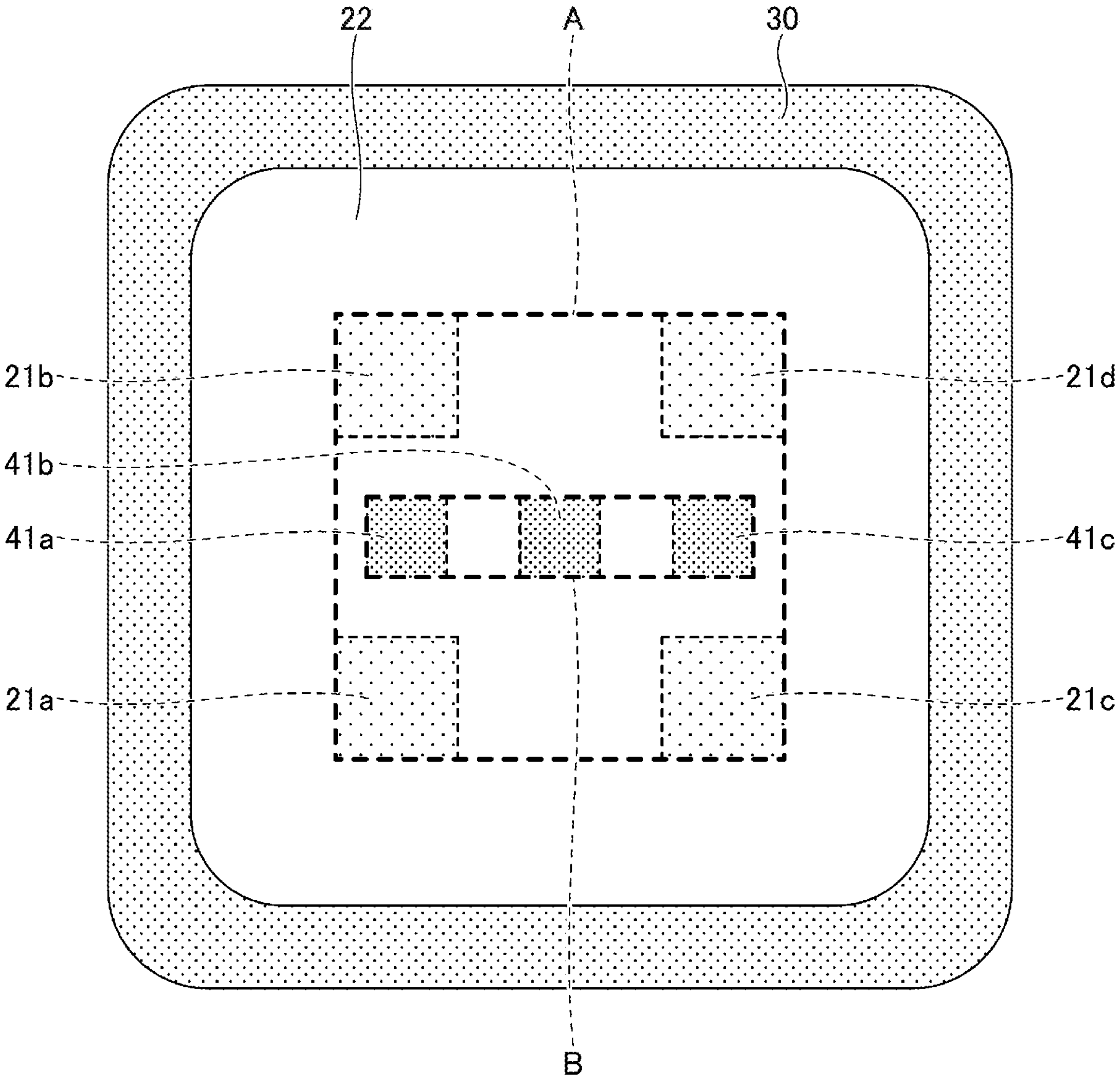
FIG. 13 is a partial plan view illustrating a modification of the light emitting surface of the light emitting device (that is, the region surrounded by the covering member) according to the second embodiment.

As illustrated in FIG. 13, the number of light emitting elements 41 constituting a part of a second light source may be three or more. In the example of FIG. 13, three light emitting elements 41*a*, 41*b*, and 41*c* are disposed within a rectangular shape A and are spaced apart from one another. The light emitting elements 41*a*, 41*b*, and 41*c* constituting a part of the second light source are arranged such that sides of the outer periphery of each of the light emitting elements 41*a*, 41*b*, and 41*c* overlap a rectangular shape B. Accordingly, the light emitting elements 41*a*, 41*b*, and 41*c* are arranged in a rectangular shape as a whole in a plan view. In the example of FIG. 13, the light emitting area of the second light source can be increased by increasing the number of the light emitting elements 41.

Figure 14:
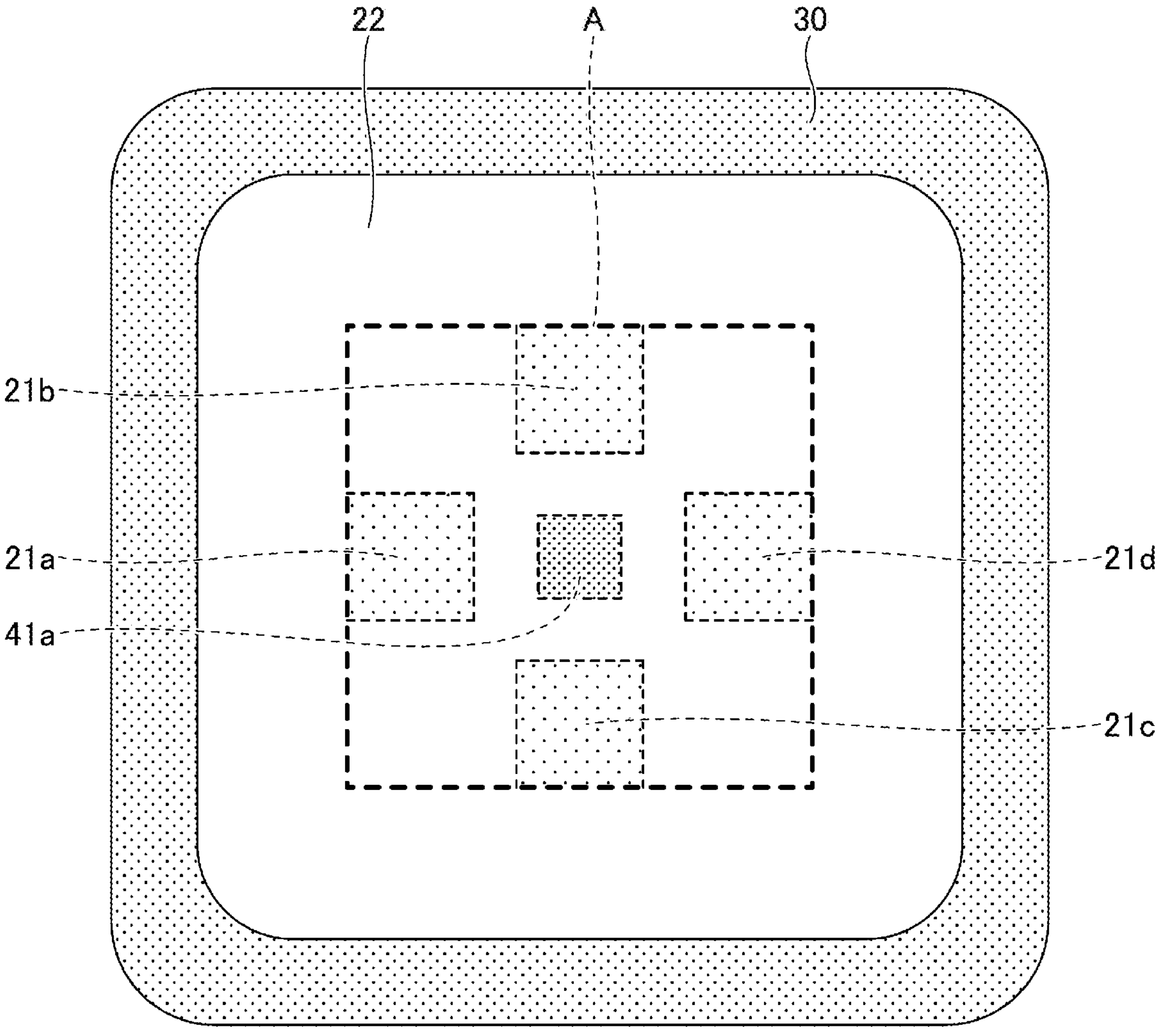
FIG. 14 is a partial plan view illustrating a modification of the light emitting surface of the light emitting device (that is, the region surrounded by the covering member) according to the second embodiment.

As illustrated in FIG. 14, the arrangement of light emitting elements 21 constituting a part of a first light source may be different from that of FIG. 10. In the example of FIG. 14, light emitting elements 21*a* through 21*d* constituting a part of a first light source are arranged such that one side of the outer periphery of each of the light emitting elements 21*a* through 21*d* overlaps a rectangular shape A. Accordingly, the light emitting elements 21*a* through 21*d* constituting a part of the first light source are arranged in a rectangular shape as a whole in a plan view. In addition, one light emitting element 41*a* having a square shape in a plan view is disposed within the rectangular shape A.

Figure 15:
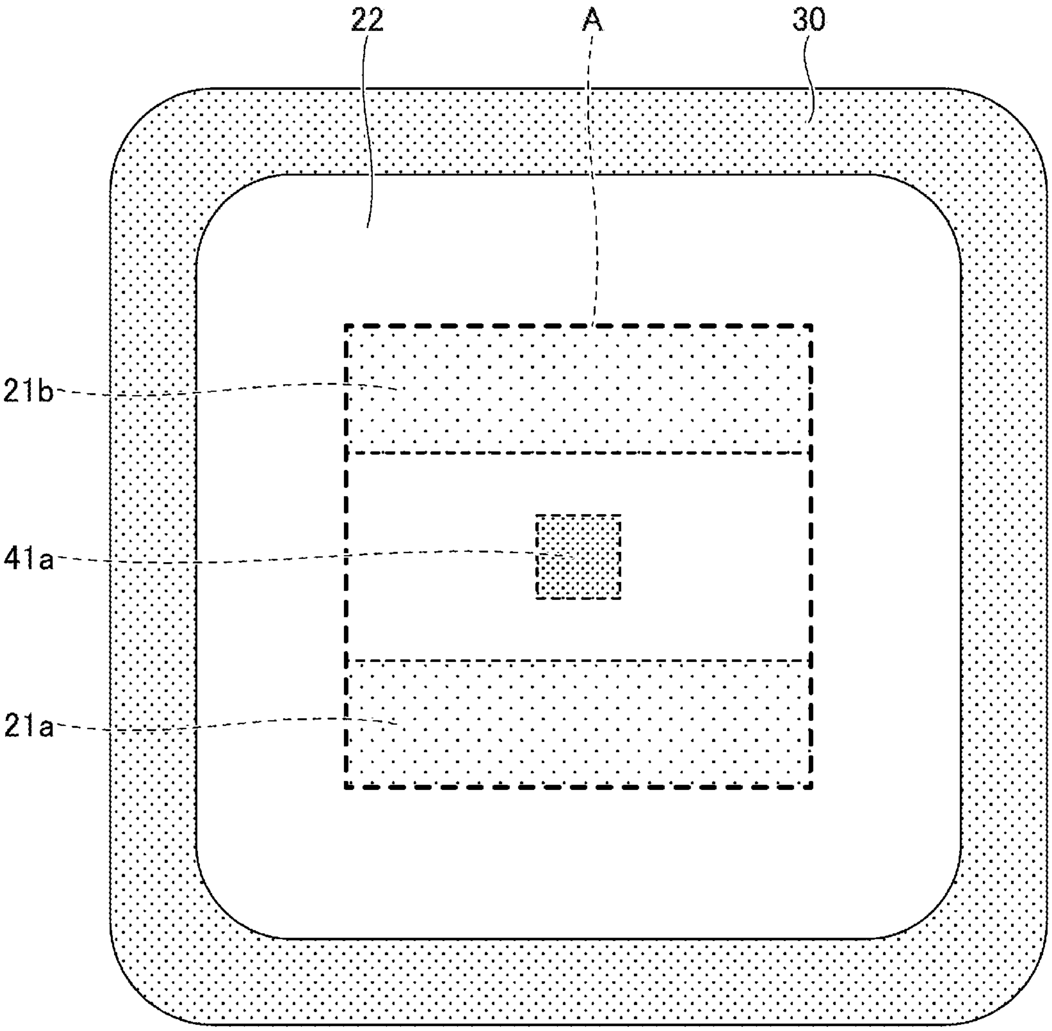
FIG. 15 is a partial plan view illustrating a modification of the light emitting surface of the light emitting device (that is, the region surrounded by the covering member) according to the second embodiment.

As illustrated in FIG. 15, light emitting elements 21 constituting a part of a first light source do not necessarily have a square shape in a plan view, and may have a rectangular shape in a plan view. In the example of FIG. 15, light emitting elements 21*a* and 21*b* constituting a part of a first light source have a rectangular shape in a plan view. The light emitting elements 21*a* and 21*b* are arranged such that three sides of the outer periphery of each of the emitting elements 21*a* and 21*b* overlap a rectangular shape A. Accordingly, the light emitting elements 21*a* and 21*b* are arranged in a rectangular shape as a whole in a plane view. The light emitting elements 21*a* and 21*b* face each other with a light emitting element 41*a* being disposed therebetween.

As illustrated in the examples of FIG. 11 through FIG. 15, the light emitting device 2 can emit desired amounts of light for a stop lamp and a tail lamp from the light emitting surface (that is, the upper surface of the light transmissive member 22) by adjusting the shapes, the numbers, and the arrangements of the light emitting elements constituting a part of the first light source and the light emitting elements constituting a part of the second light source.

Figure 16:
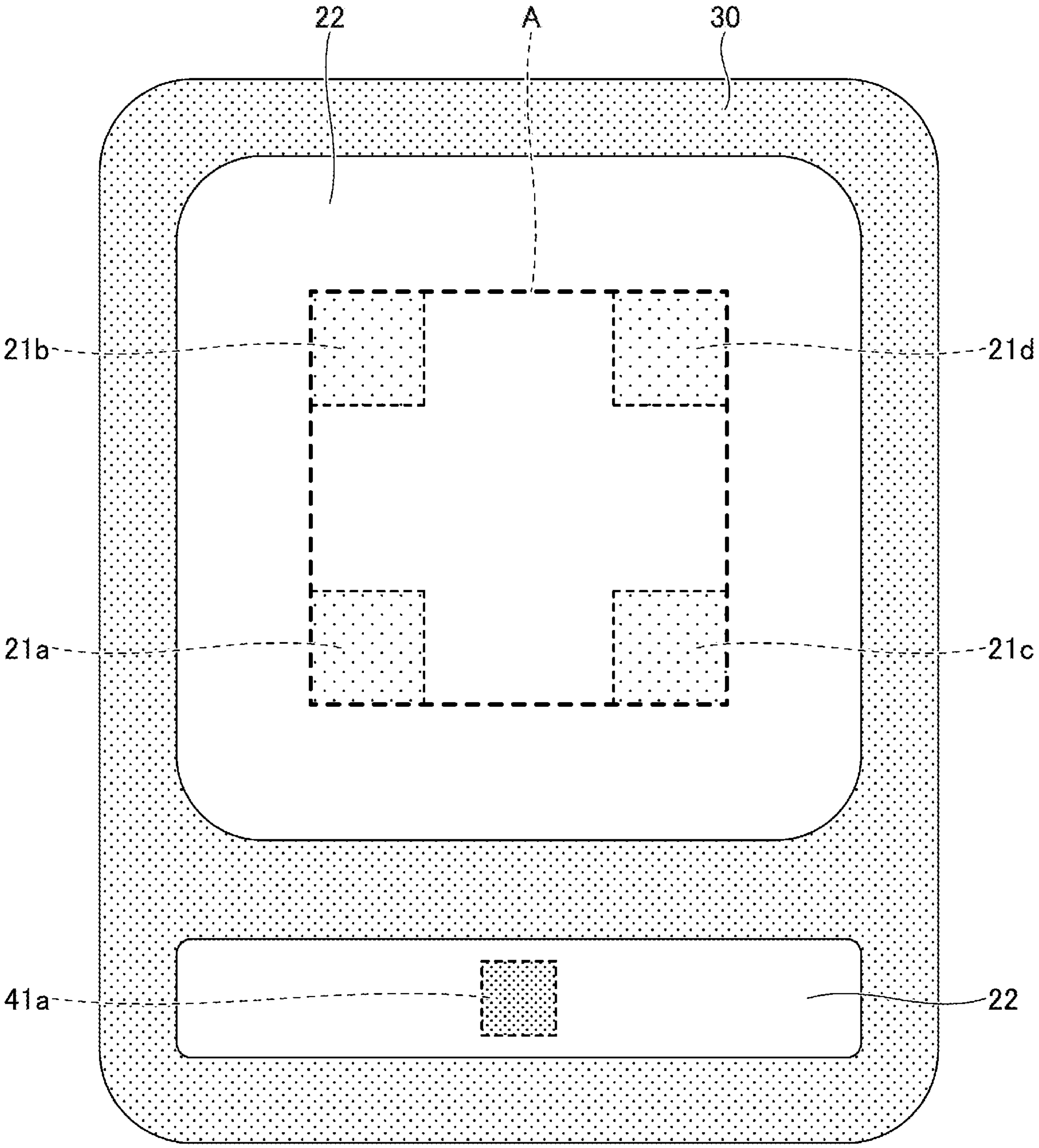
FIG. 16 is a partial plan view illustrating a modification of the light emitting surface of the light emitting device (that is, the region surrounded by the covering member) according to the second embodiment.

Further, according to another modification, as illustrated in FIG. 16, a light emitting element 41 constituting a part of a second light source may be disposed in a region separated from a region where light emitting elements 21 constituting a part of a first light source are disposed. In the example of FIG. 16, a light emitting element 41*a* constituting a part of a second light source is disposed in a region separated from a region where light emitting elements 21*a* through 21*d* constituting a part of a first light source are disposed. Accordingly, light emitting regions of the first light source and the second light source can be separate from each other.

When the light emitting region of the first light source and that of the second light source are separate from each other, the light emitting device can have a plurality of light emitting surfaces. This allows for facilitating the first light source and the second light source to have different combinations of phosphors. For example, the first light source and the second light source can emit light of different colors. Further, with the separation between the light emitting region of the first light source and that of the second light source according to the functions, optical designs appropriate for the respective light sources can be made.

According to an embodiment of the present disclosure, the size of a light emitting device that includes a protection circuit can be reduced.

Although embodiments and the like have been described in detail above, the present invention is not limited to the above-described embodiments and the like, and various modifications and substitutions can be made to the above-described embodiments and the like without departing from the scope recited in the claims.

What is claimed is:

1. A light emitting device comprising:

a substrate having a first surface;

a light source disposed on the first surface;

a covering member disposed on the first surface and having a frame shape surrounding the light source in a plan view; and a circuit disposed on the substrate; wherein:

the circuit comprises a drive circuit, and a protection circuit that is connected in parallel to the drive circuit;

the drive circuit is configured to drive the light source, and the protection circuit comprises first and second protection elements that are connected in series with reversed polarities; and the covering member covers and directly contacts the first and second protection elements.

2. The light emitting device according to claim 1, wherein the first and second protection elements are bare chips.

3. The light emitting device according to claim 1, further comprising:

a plurality of connection terminals connected to the circuit and disposed along an outer periphery of the first surface in the plan view.

4. The light emitting device according to claim 3, wherein:

the connection terminals are disposed along a first side of the first surface;

the covering member has a rectangular frame shape surrounding the light source in the plan view;

the covering member has:

a first region extending parallel to the first side of the first surface and located at a side corresponding to the first side of the first surface, a second region extending parallel to the first side and located at a side corresponding to a second side of the first surface that is opposite the first side of the first surface, a third region connecting a first end of the first region and a first end of the second region, and a fourth region connecting a second end of the first region and a second end of the second region; and the first and second protection elements are disposed in one or more of the first region, the third region, and the fourth region.

5. The light emitting device according to claim 4, wherein the first and second protection elements are disposed in the first region.

6. The light emitting device according to claim 1, wherein:

the light source comprises a plurality of light emitting elements, and a light transmissive member that covers the light emitting elements; and the light emitting elements are arranged in a rectangular shape as a whole in the plan view.

7. The light emitting device according to claim 6, wherein:

the light emitting elements are blue light emitting elements; and the light transmissive member contains a red phosphor.

8. The light emitting device according to claim 6, wherein:

the drive circuit comprises an integrated circuit;

the light emitting elements include a first light emitting element, and a second light emitting element that is connected in series with the first light emitting element; and the first light emitting element and the second light emitting element are connected in parallel to the integrated circuit.

9. The light emitting device according to claim 1, wherein the drive circuit comprises an integrated circuit.

10. The light emitting device according to claim 8, wherein:

the integrated circuit has a rectangular shape in the plan view and is disposed along an outer periphery of the covering member.

11. The light emitting device according to claim 1, wherein:

the light source includes a first light source and a second light source;

the drive circuit comprises:

a first drive circuit configured to drive the first light source, and a second drive circuit configured to drive the second light source; and the first drive circuit and the second drive circuit are configured to be driven independently from each other.

* * * * *